United States Patent [19]
Dietzsch et al.

[11] Patent Number: 4,616,693
[45] Date of Patent: Oct. 14, 1986

[54] HEATING AND/OR AIR CONDITIONING APPARATUS FOR AUTOMOTIVE VEHICLES

[75] Inventors: Kurt Dietzsch, Leonberg-Eltingen; Karlheinz Witzel, Stuttgart, both of Fed. Rep. of Germany

[73] Assignee: Sueddeutsche Kuehlerfabrik Julius Fr. Behr GmbH & Co. KG, Stuttgart, Fed. Rep. of Germany

[21] Appl. No.: 645,091

[22] Filed: Aug. 28, 1984

[30] Foreign Application Priority Data

Sep. 3, 1983 [DE] Fed. Rep. of Germany ....... 3331890

[51] Int. Cl.$^4$ ................................................ B60H 3/00
[52] U.S. Cl. ..................................... 165/41; 165/80.3; 62/259.2; 62/239
[58] Field of Search ............... 165/51, 41, 42, 80 B; 361/381; 62/259.2, 239; 237/12.3 A

[56] References Cited
U.S. PATENT DOCUMENTS

| 3,364,838 | 1/1968 | Bradley | 165/80 B |
| 4,500,944 | 2/1985 | Roberts et al. | 361/384 |

FOREIGN PATENT DOCUMENTS 2608811  5/1977  Fed. Rep. of Germany .

*Primary Examiner*—Henry Bennett
*Attorney, Agent, or Firm*—Schwartz, Jeffery, Schwaab, Mack, Blumenthal & Evans

[57] ABSTRACT

Disclosed is a heating and/or air-conditioning installation for automotive vehicles comprising at least one blower and a flap for affecting the flow of air, and an electronic control device for rotational speed control or speed shifting. The control device which comprises one or more electronic components capable of generating significant amounts of heat, is mounted on the flap, in order to cool the electronic components while only minimally interfering with the flow of air in the heating and/or air-conditioning installation.

23 Claims, 11 Drawing Figures

HEATING AND/OR AIR CONDITIONING APPARATUS FOR AUTOMOTIVE VEHICLES

BACKGROUND OF THE INVENTION

The present invention relates to a heating and/or air-conditioning apparatus for automotive vehicles.

Heating and air-conditioning installations for automotive vehicles comprising a blower, heat exchanger and flaps to influence the flow of air, are already known. It is further known from German Patent No. 27 24 69 to arrange electronic components, which are capable of generating considerable amounts of heat, in planar contact with appropriate cooling bodies.

Cooling surfaces or suitable cooling bodies should be positioned to assure sufficient heat removal. Thus, for example, it has already been proposed in U.S. Pat. No. 2,786,173 to arrange a power resistor which generates significant amounts of heat, outside the passenger compartment, on the outside of the dashboard. Such a solution is, however, impractical because additional electrical conduits and connections are required, and the apparatus cannot be mounted as a complete unit but must be subsequently assembled in the vehicle.

It has further been attempted to arrange electronic components generating significant amounts of heat in the blower housing, so that a constant flow of air would be available to remove the heat from the cooling elements. It has been discovered, however, that such a measure results in an appreciable interference with the flow of air and the generation of noise.

SUMMARY OF THE INVENTION

It is therefore an object of the present invention to provide a heating and/or air-conditioning apparatus for automotive vehicles in which electronic components which generate substantial amounts of heat are sufficiently and reliably cooled.

Yet another object of the present invention is the provision of a heating and/or air-conditioning apparatus having the above characteristics and in which repair and replacement of the electronic structural part is as simple as possible.

Another object of the present invention is to provide a heating and/or air-conditioning apparatus for automotive vehicles having the above characteristics and which impedes the flow of air to the least possible extent.

In accordance with one aspect of the present invention, there has been provided a heating and/or air-conditioning installation for automotive vehicles, comprising at least one blower, at least one flap which affects the air flow through the installation, and an electronic control structure which includes at least one heat-generating structural part mounted on said flap.

Further objects, features and advantages of the present invention will become apparent from the detailed description of preferred embodiments which follows, when considered with the attached figures of drawing.

BRIEF DESCRIPTION OF THE DRAWINGS

In the drawings:

FIG. 3b is a cross-sectional view along line III—III of FIG. 3a;

FIG. 3c is a cross-sectional view along line II—II of FIG. 3a;

FIG. 4a is a variant of the embodiment of FIG. 3a;

FIG. 4b is a cross-sectional view along line IV—IV of FIG. 4a;

DETAILED DESCRIPTION OF PREFERRED EMBODIMENTS

Figure 1:
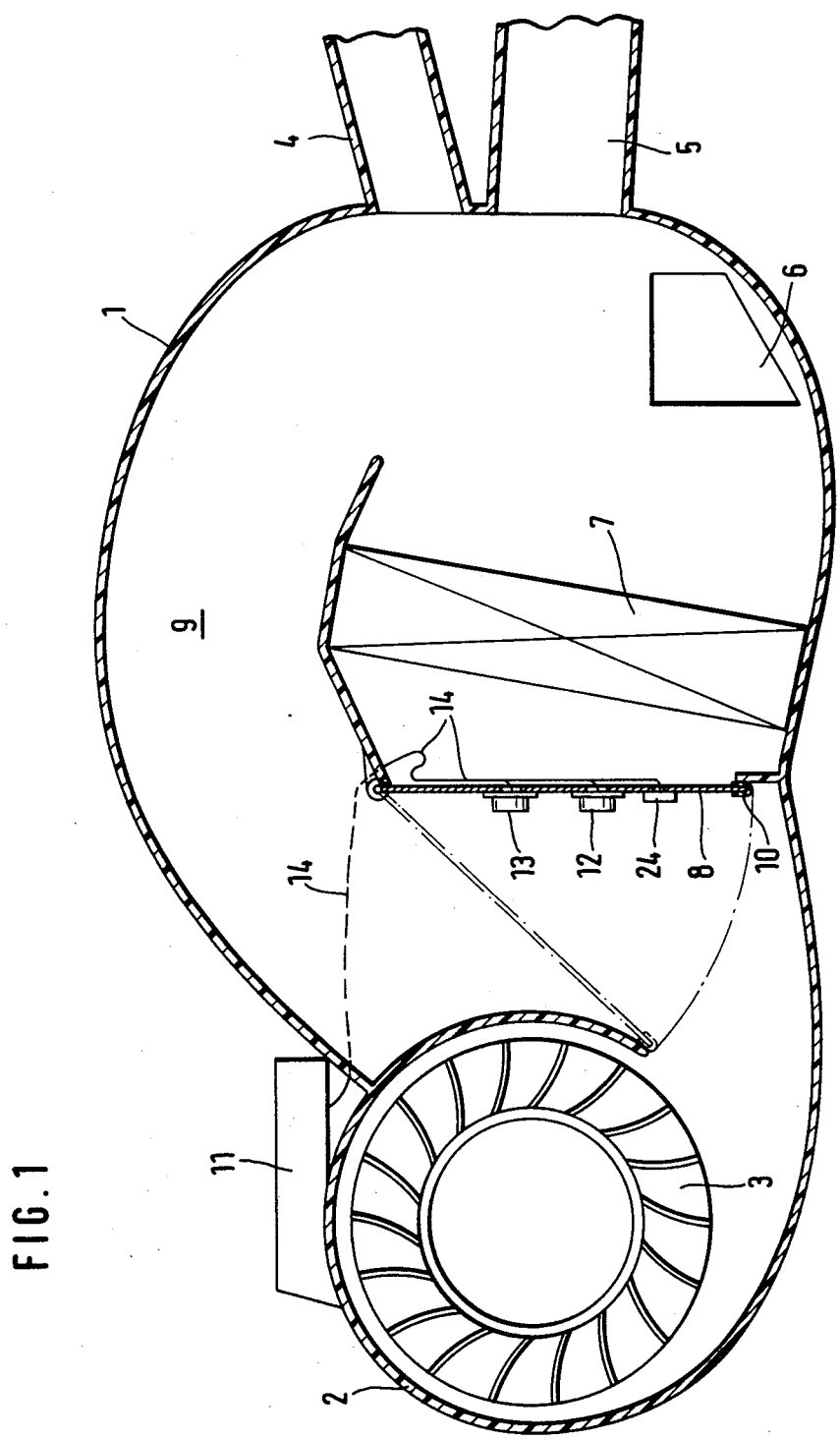
FIG. 1 is a schematic view of a heating installation for automotive vehicles with electronic components being arranged on the temperature mixer baffle.

The apparatus according to the present invention not only assures satisfactory cooling of the electronic components, but does not require additional space in the installation of alterations in the configuration of the housing. Depending on the type and the embodiment of the installation, the electronic components may be located on different flaps, for example, the temperature mixing flap or a fresh air-air recirculation baffle.

In an especially advantageous embodiment of the invention, the flap is made of a material having good thermal conductivity, in particular a metal, and the electronic component part is connected with the flap to form a joint having thermal conductivity. In this manner, the existing flap provides a body having a large cooling surface. Since at least one side of the flap is always exposed to the flow of air, the relatively large thermal conducting surface assures adequate cooling.

To improve the distribution of heat in the flap, the flap can be equipped in the area of the electronic components with areas of increased thickness. These thicker flap areas can be molded onto the flap in a particularly simple manner if the flap is extruded.

Power transistors, thermistors and power resistances are examples of electronic components capable of generating significant amounts of heat. These electronic components, which are arranged on the flap, are connected by means of a cable with the electrical system of the vehicle or a control device.

The electronic components may be mounted, depending on the type and configuration, on a temperature mixing flap downstream of the blower or on a fresh air-air recirculation baffle located on the upstream side of the blower. To optimize the flow of air and/or to increase the heat transfer surface, additional surface-modifying means can be provided on the flap. These surface-modifying means include suitably shaped beads formed in the material of the flap, ribs molded onto or metal strips attached by welding to the flap.

In a further embodiment of the present invention, a printed circuit is attached to the rear side of the flap on which the electronic control device is arranged. This arrangement provides for further integration whereby the entire electronic unit for the control of the blower can be arranged on a printed circuit. In order to provide the necessary installation space for the structural elements of the electronic control device, not joined in a thermally conducting manner to the flap, an orifice can be provided in the flap between the power transistors. The orifice is equipped with a hood like cover. In this manner, the structural elements of the electric control device may extend into the orifice of the flap, thus requiring only a small distance between the printed circuit and the flap. In place of the flap orifice with its hood-like cover, a vaulting of the flap may be provided to assure the necessary installation space for the structural elements of the electronic control device. The structural elements of the electronic control device are in part heat sensitive in contrast to the power carrying elements. It is therefore proposed to embed the electronic control device in a synthetic resin or to provide it with an appropriate cover. This measure further prevents air turbulence in the structural elements.

As mentioned above, the heat-generating component can comprise a PTC resistance. In this case, it is convenient to position the PTC resistance so that it rests on one side against the flap over a large surface area and on the other side facing away from the flap against a metal plate, with both the flap and the plate serving as electrical connections for the PTC resistance.

If the heat-developing electronic components are power resistors, it is possible to mount the resistors on the flap with the insertion of insulating pieces. In this case the power resistors are in the air flow and are therefore cooled, but the flap is not involved in the transfer of heat. It is, however, also possible to divide the flaps into several metallic zones, electrically insulated against each other and to use the zones as electrical connections for the power resistors. In this manner, the power resistors are supported directly by the metallic zones which thus act as cooling bodies.

In order to facilitate the replacement of the electronic components in the course of repairs, it is convenient to assemble the flap from a frame and a removable plate and to fasten the electronic components to the plate. In this manner, it is not necessary to remove the flap itself from its pivoting bearing, but merely to take the plate off the frame.

It is further advantageous to mount a temperature sensor on the flap, which, in case of an excessive generation of heat by the electronic components, deactivates the control device for the blower, thereby preventing damage due to overheating of the electronic parts.

With reference to the drawings, FIG. 1 schematically illustrates a housing 1 of a heating installation for automotive vehicles, comprising a helical housing 2 of a radial blower 3 and a plurality of air outlet fittings 4, 5 and 6. Located between the radial blower 3 and the outlet fittings 4, 5 and 6 are a heating body 7 and a bypass 9 leading around the heating body. The proportion of the air flowing through the heater body 7 and the bypass 9, respectively, are regulated by means of a pivotally mounted temperature mixing baffle 8 located on the air inlet side of the heater body 7. The temperature mixing baffle comprises a thermally conductive material and is equipped on its circumference with a foam rubber strip 10 to provide good sealing.

An electronic control device 11 for the radial blower 3 is arranged on the outside of the helical blower housing 2. Two power transistors 12 and 13 are mounted on the temperature mixing baffle 8 and are connected by means of a cable 14 with the control device 11. The power transistors 12 and 13 are known to involve an appreciable loss of power combined with the generation of a corresponding amount of heat. Accordingly, the above-described arrangement transfers the heat from the power transistors 12 and 13 to the entire surface of the temperature mixing baffle 8 and continuously removes the heat by the passage of air along the baffle. Additionally, a temperature sensor 24 is fastened to the temperature mixing baffle 8 to produce a deactivation of the control device 11 and the power transistors 12, 13 if a maximum permissible temperature is exceeded.

Figure 2:
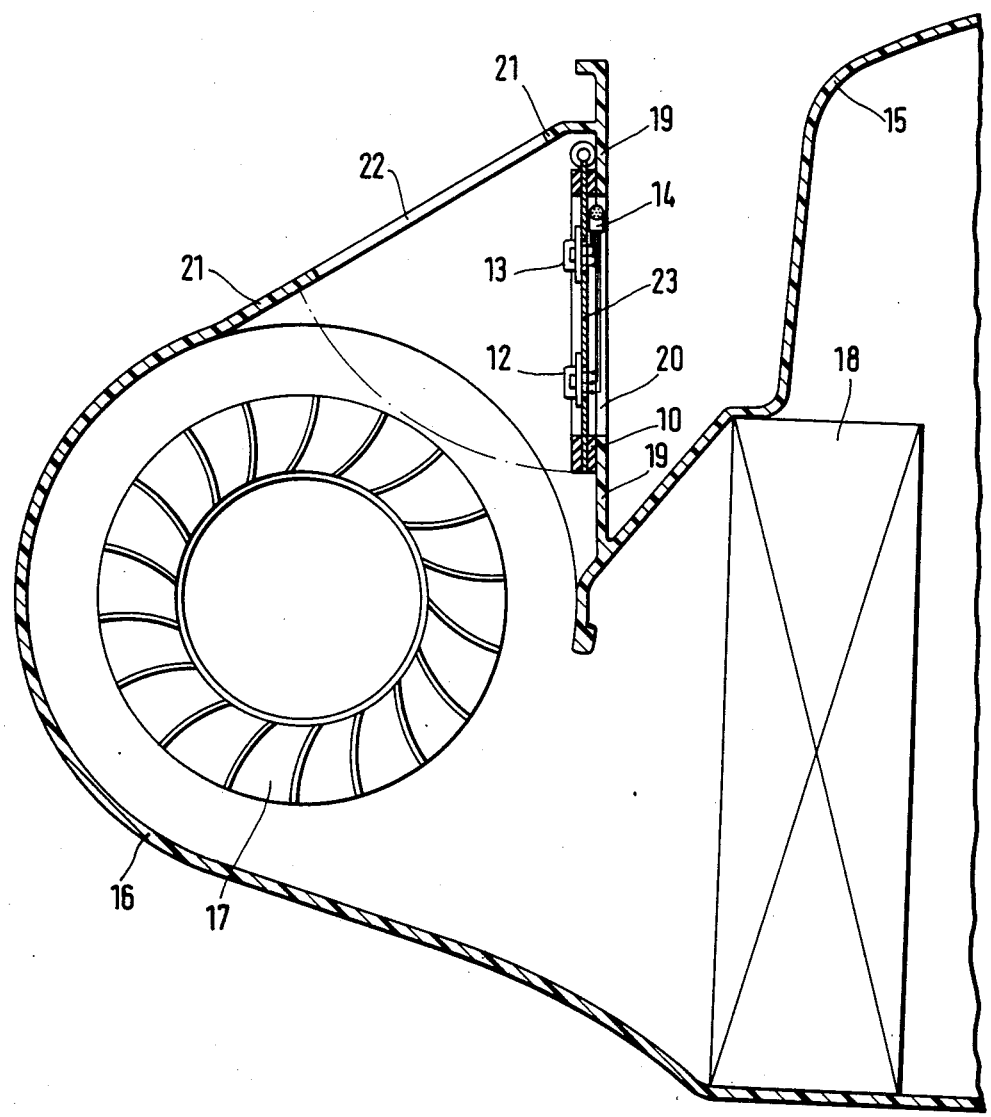
FIG. 2 a cross-sectional view of an air-conditioning installation for automotive vehicles.

FIG. 2 is a sectional view of the air-conditioning installation of the present invention, wherein 15 designates the housing and 16 the helical housing of a radial blower 17. The radial blower is followed in sequence in the housing 15 by an an evaporator 18. In the housing wall 19, an orifice 20 is provided for circulation of air, and an orifice 22 is provided in the housing wall 21 for fresh air. The housing walls 19 and 21 are arranged at an angle to one another. The orifices 20 and 22 can be selectively closed by a pivotong flap 23 having a rubber strip on its sealing surfaces. The flap 23 serves to affect the respective proportions of fresh air and circulating air. The flap 23 has a rubber strip on its sealing surfaces. As in the case of the temperature mixing flap in FIG. 1, two power transistors 12 and 13 are fastened to the flap 23 and connected by means of a cable 14 with an electronic control device (not shown). The flap 23 comprises a metal plate having good thermal conductivity, to remove the heat generated by the power transistors which is a function of their power loss.

Figure 3A:
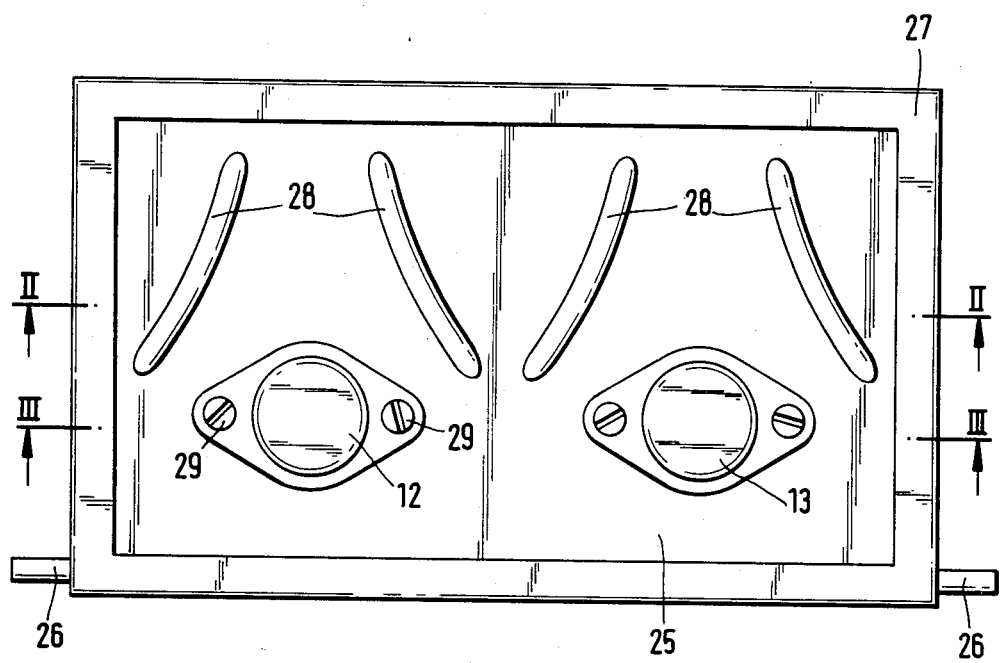
FIG. 3a is a top view of a closing flap with power transistors mounted thereon.

FIG. 3a is a top view of a closing flap 25 comprising two journals 26 for pivoting support and a sealing strip 27. The flap 25 further comprises a plurality of beads 28 to guide the flow of air. Two power transistors 12 and 13 are fastened to the flap 25 by means of screws 29. In place of beads, the guide elements 28 may be in other forms, for example, as metal strips welded to the flap.

Figure 3B:
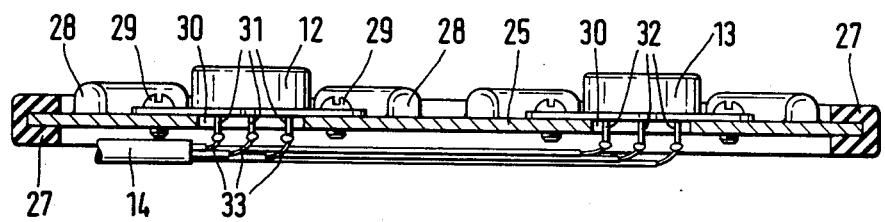

FIG. 3b is a cross-sectional view taken along the line III—III of FIG. 3a. Shown from this view, the flap 25 comprises two orifices 30, through which the connector pins 31 and 32 of the power transistors 12 and 13 pass to the reverse side of the flap 25. The individual wires 33 of the connecting cable 14 are soldered to the connector pins 31 and 32 of the two power transistors 12 and 13.

Figure 3C:
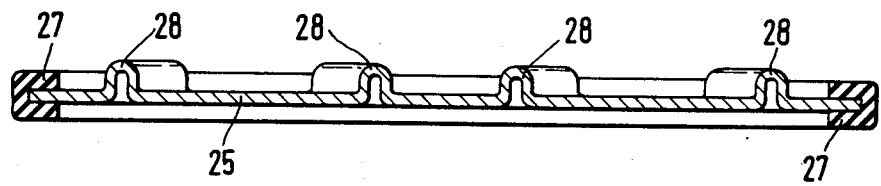

FIG. 3c is a sectional view taken along the line II—II of FIG. 3a. As shown in this view, the beads 28 which serve to guide the flow of air, are pressed from the material of the flap 25.

Figure 4A:
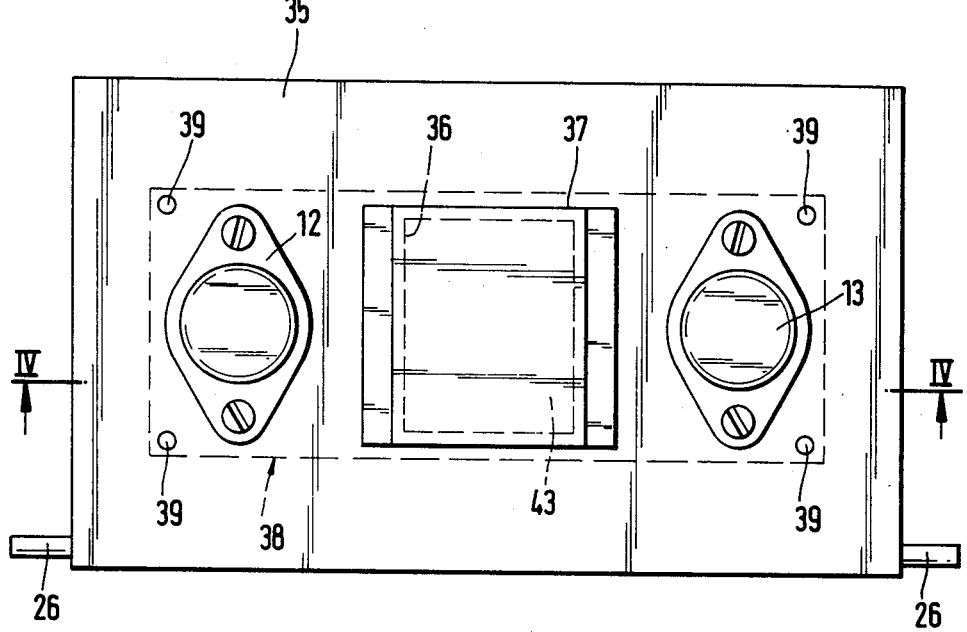

FIG. 4a is a top view of a flap 35, upon which not only the power transistors 12 and 13, but also the entire electronic control device is mounted. An orifice 36 is located in the flap 35 between the two power transistors 12 and 13. The flap is closed in an air tight manner by a hood like cover 37. Mounted on the reverse side of the flap 35 by means of screws 89 is a printed circuit 38 carrying an electronic control device 43.

Figure 4B:
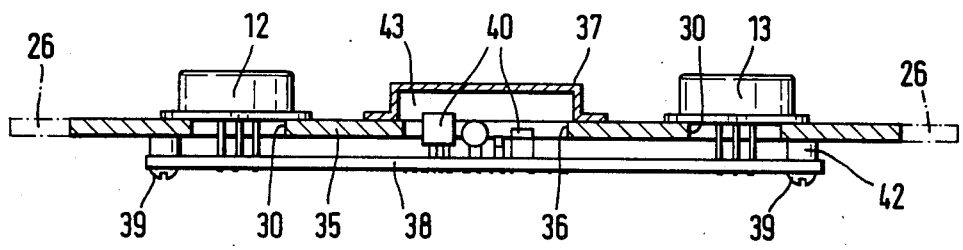

FIG. 4b is a sectional view taken along the line IV-IV of FIG. 4a. According to this view, a printed circuit 38 is mounted by means of spacers 42 at a predetermined distance from the flap 35. The connector pins 31 and 32 of the power transistors 12 and 13 protrude through the printed circuit plate and are soldered to appropriate conductor strips on the side of the printed circuit 38 facing away from the flap 35. In the area of the orifice 36 of the flap 35 on the printed circuit 38, the structural elements of the electronic control device 43 are arranged, with the elements 40 of the electronic control device 43 extending into the cavity formed by the hood-like cover 37. The connections of the elements 40 are also soldered to conductor strips on the opposite side of the printed circuit 38.

Figure 4C:
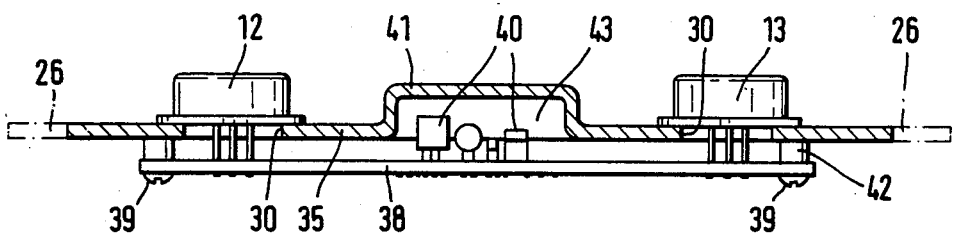
FIG. 4c is a variant of the embodiment of FIG. 4b.

FIG. 4c illustrates a layout similar to that of FIG. 4b. The difference between the embodiments is that the flap 35 does not have an orifice 36 or cover 37. Instead, the space needed for the structural elements 40 of the control device 43 is provided in the form of a vaulting 41 molded from the material of the flap 35.

Figure 5:
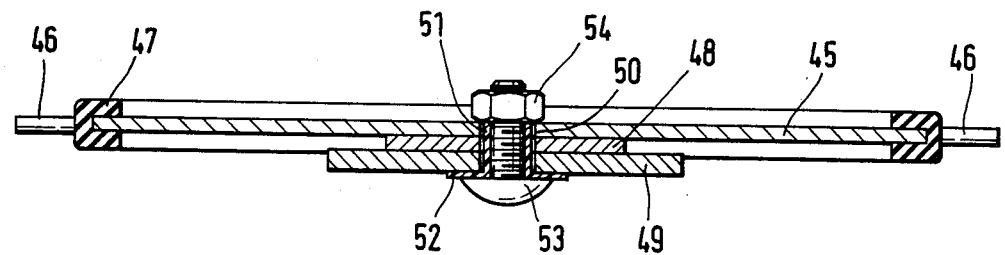
FIG. 5 is a cross-sectional view through a closing flap having a thermistor mounted thereon.

FIG. 5 is a sectional view taken through a flap 45, equipped with a journal 46 for pivoting support, and a sealing strip 47. A PTC resistor 48 rests in planar contact against the flap 45 comprising a metallic material having good electrical and thermal conductivities. The resistor 48 serves both to continuously control the power and to limit the current supplied to a blower motor, which is a function of temperature. A metal plate 49 is located in planar contact with the PTC resistor 48 on the side facing away from the flap 45. Because both the flap 45 and the plate 49 are electrical conductors, they serve as electrical connections for the PTC resistance 48. A continuous bore 50 passes through the flap 45, the PTC resistor 48 and the plate 49. The bore 50 has an insulating sleeve 51 arranged therein with a collar 52 resting against the plate 49. A threaded bolt 53 protrudes through the insulating sleeve 51, the head of which abutts against the collar 52. A nut 54 is screwed on the threaded portions of the threaded bolt 53, thereby clamping together the unit comprising the flap 45, the PTC resistor 48 and the plate 49. In place of the bolt 53 and the nut 49, rivets or any other appropriate fastening means can be used.

Figure 6:
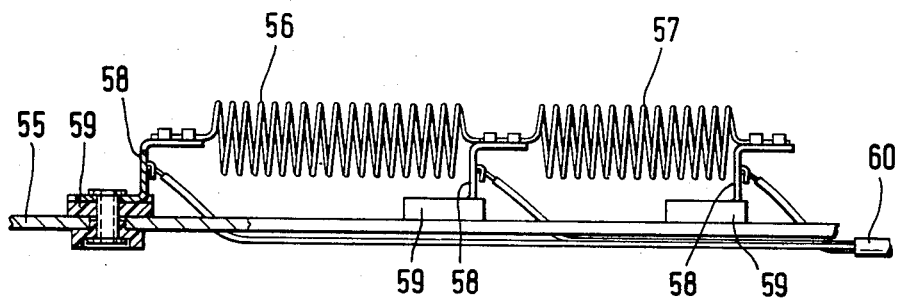
FIG. 6 is a cross-sectional view through a closing flap having a fixed resistor mounted thereon.

FIG. 6 is a cross-sectional view through a flap 55 comprising a material having good thermal conductivity. Arranged on the flap 55 are two power resistors 56 and 57 which, by virtue of their mounting on suitable angular brackets 58, are spaced apart from the flap 55. The angular brackets 58 simultaneously serve as electrical connectors and are attached by means of insulating pieces 59 to the flap 55. The wires of a connecting cable 60 are also attached to the angular brackets 58.

Figure 7:
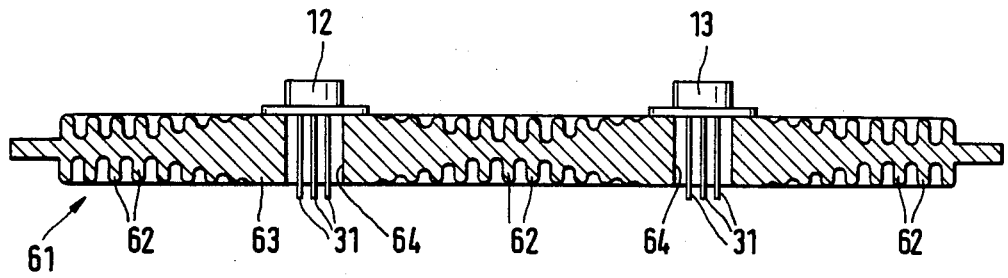
FIG. 7 is a cross-sectional view through a flap having thickenings and ribs.

FIG. 7 illustrates a flap 61 produced in the form of an extrusion comprising areas of larger cross-section, referred to hereinafter as "thickenings" 63. The power transistors 12, 13 are attached in the area of the thickenings 63, with their connector pins 31, 32 passing through the orifices 64. A plurality of ribs are molded onto the flap 61 adjacent to the thickenings 63. The ribs serve both to increase the heat transfer area and to guide the flow of air.

As seen from the preceding examples, the arrangement of electrical power elements capable of generating large amounts of heat on flaps which are exposed to the flow of air is advantageous. It is also possible, similarly, to apply to the flap an insulating layer which advantageously can be provided with suitable tracks which exhibit the appropriate resistivity characteristics. The power resistances formed in this manner not only eliminate mounting additional structural elements on the plate, but do not result in an increase in resistance to the flow of air in comparison to conventional flat flaps.

In a further embodiment, the flap is formed from a frame and a metal plate is releasably fastened to the frame. The electronic components, and optionally the control device, are supported by the metal plate. In case of failure of the electric circuit, the electronic components and the control device may be readily replaced merely by removing and replacing the completely equipped plate.

What is claimed is:

1. A heating and/or air-conditioning installation for automotive vehicles, comprising:
   at least one blower;
   at least one flap which affects the air flow through the installation;
   an electronic control element which includes at least one heatgenerating electronic component mounted on said flap; and a thermally conductive connection for joining said flap to said component.

2. A heating and/or air-conditioning installation as claimed in claim 1, wherein said electronic control element comprises a device for controlling the rotational speed of the blower.

3. A heating and/or air-conditioning installation as claimed in claim 1, wherein said flap comprises a thermally conductive material.

4. A heating and/or air-conditioning installation as claimed in claim 3, wherein said thermally conductive material comprises a metal.

5. A heating and/or air-conditioning installation as claimed in claim 1, wherein said flap comprises areas of increased thickness in the area adjacent to said electronic component.

6. A heating and/or air-conditioning installation as claimed in claim 5, wherein said flap comprises an extruded flap.

7. A heating and/or air-conditioning installation as claimed in claim 1, said component comprises at least two power transistors and a cable for connecting said power transistors with said electronic control element.

8. A heating and/or air-conditioning installation as claimed in claim 1, wherein said flap comprises a temperature mixing baffle.

9. A heating and/or air-conditioning installation as claimed in claim 1, wherein said flap is positioned on the upstream side of said blower.

10. A heating and/or air-conditioning installation as claimed in claim 1, wherein said flap comprises a fresh air/circulating air baffle.

11. A heating and/or air-conditioning installation as claimed in claim 1, wherein said flap includes means for increasing the heat transfer surface area and/or guiding the flow of air.

12. A heating and/or air-conditioning installation as claimed in claim 11, wherein said means is selected from shaped beads in the flap material, ribs molded onto the flap or metal strips welded to the flap.

13. A heating and/or air-conditioning installation as claimed in claim 7, wherein said flap comprises a plurality of orifices and said power transistors include a plurality of connector pins, wherein said connector pins pass through said orifices to the reverse side of said flap.

14. A heating and/or air-conditioning installation as claimed in claim 7, further comprising a printed circuit plate mounted on the reverse side of said flap, wherein said control element is mounted on said circuit plate.

15. A heating and/or air-conditioning installation as claimed in claim 7, further comprising an orifice between said power transistors, and a hood-like cover over said orifice, wherein said control element extends into said orifice.

16. A heating and/or air-conditioning installation as claimed in claim 7, further comprising a vaulting between said power transistors, wherein said control element extends into said orifice.

17. A heating and/or air-conditioning installation as claimed in claim 7, wherein said control device comprises at least one structural element which is equipped with a synthetic plastic cover, embedded in a synthetic resin or provided with a plastic coating.

18. A heating and/or air-conditioning installation as claimed in claim 17, wherein said structural element comprises a PTC resistor.

19. A heating and/or air-conditioning installation as claimed in claim 18, wherein said PTC resistor is positioned between said flap and a metal plate, said flap and metal plate serving as electric connectors for said PTC resistor.

20. A heating and/or air-conditioning installation as claimed in claim 17, wherein said component comprises a power resistance.

21. A heating and/or air-conditioning installation as claimed in claim 20, wherein said flap comprises a plurality of metallic zones electrically insulated from one another, wherein said zones function as electrical connectors for said power resistor and as cooling bodies.

22. A heating and/or air-conditioning installation as claimed in claim 18, wherein said flap comprises a frame and a removable plate, wherein said electronic component is mounted on said plate.

23. A heating and/or air-conditioning installation as claimed in claim 1, further comprising at least one temperature sensor arranged on said flap.

* * * * *